United States Patent [19]
Lee

[11] Patent Number: 5,652,430
[45] Date of Patent: Jul. 29, 1997

[54] DIRECT RADIOGRAPHIC IMAGING PANEL

[75] Inventor: Denny L. Y. Lee, West Chester, Pa.

[73] Assignee: Sterling Diagnostic Imaging, Inc., Newark, Del.

[21] Appl. No.: 642,772

[22] Filed: May 3, 1996

[51] Int. Cl.$^6$ .................................................. G01T 1/24
[52] U.S. Cl. ........................ 250/370.09; 250/578.1
[58] Field of Search ........................... 250/370.09, 578.1, 250/580

[56] References Cited

U.S. PATENT DOCUMENTS

| | | | |
|---|---|---|---|
| 3,660,667 | 5/1972 | Weimer | 250/209 |
| 3,946,151 | 3/1976 | Kamiyama et al. | 178/7.1 |
| 4,660,667 | 4/1987 | Uchimura et al. | 177/164 |
| 4,672,454 | 6/1987 | Cannella et al. | 358/213.11 |
| 4,675,739 | 6/1987 | Catchpole et al. | 378/98.8 |
| 4,746,804 | 5/1988 | Kitamura et al. | 250/578 |
| 4,797,560 | 1/1989 | Berger et al. | 250/578 |
| 4,827,145 | 5/1989 | Arques | 250/578 |
| 4,912,537 | 3/1990 | Boyd | 257/229 |
| 4,945,243 | 7/1990 | Arques | 250/367 |
| 4,954,895 | 9/1990 | Akimoto et al. | 358/213.11 |
| 4,980,553 | 12/1990 | Henry | 250/369 |
| 5,079,426 | 1/1992 | Antonuk et al. | 250/370.09 |
| 5,182,624 | 1/1993 | Tran et al. | 257/40 |
| 5,254,480 | 10/1993 | Tran | 437/2 |
| 5,262,649 | 11/1993 | Antonuk et al. | 250/370.09 |
| 5,313,066 | 5/1994 | Lee et al. | 250/370.09 |
| 5,319,206 | 6/1994 | Lee et al. | 250/370.09 |
| 5,331,179 | 7/1994 | Lee et al. | 250/591 |
| 5,381,014 | 1/1995 | Jeromin et al. | 250/370.09 |
| 5,532,491 | 7/1996 | Hassler et al. | 250/370.09 |

OTHER PUBLICATIONS

Lee, Denny L., Jeromin, Lothar S., & Cheung Lawrence K., The Physics of a New Direct Digital X-Ray Detector, Computer Assisted Radiology, Springer Verlac, Berlin, 1995, pp. 83–88.

Jeromin, Lothar S., Lee, Denny L., Palecki, Eugene F., Lawrence, Edward N., A Direct Radiography System for the Future, (place and date of publication not identified), pp. 110–116.

Primary Examiner—Constantine Hannaher
Attorney, Agent, or Firm—Ratner & Prestia

[57] ABSTRACT

A radiation detection panel for X-ray imaging systems is made up of an assembly of radiation detector sensors arrayed in rows and columns. Each sensor includes a radiation detector connected to a charge storage capacitor. Each capacitor is connected to a diode. When proper biasing voltages are applied to the sensor, capacitor, and diode, the diode is reverse biased and radiation induced charges accumulate in the capacitor. When the biasing voltages are changed appropriately, the diode is forward biased and the stored charge flows from the capacitor to a detector. Both still and moving images may be displayed.

32 Claims, 7 Drawing Sheets

DIRECT RADIOGRAPHIC IMAGING PANEL

BACKGROUND OF THE INVENTION

1. Field of the Invention

This invention relates to radiation sensors in general and more particularly to a radiation detection panel comprising a plurality of radiation sensors each associated with a protective and addressing diode.

2. Description of Related Art

Radiation sensors able to convert incident radiation directly to an electrical charge indicative of the intensity of the incident radiation are known. Typically such sensors comprise a complex structure which includes a bottom and a middle conductive electrode separated by a dielectric to form a capacitor, a photoconductive layer over one of the electrodes and a top electrode over the photoconductive layer to apply a charging voltage to the sensor. The structure thus forms two capacitors connected in series. A voltage is applied between the bottom and top electrodes charging the two capacitors. Upon exposure to radiation the photoconductor becomes conductive altering the charge distribution in the two capacitors. With proper selection of electronics and materials this results in a charge accumulated and stored in the capacitor formed by the bottom and middle electrodes which is proportional to the exposure to the incident radiation.

Read-out of the stored charge is usually done by addressing the middle electrode and flowing the accumulated charge to a charge measuring device such as a charge integrating amplifier.

A plurality of such sensors may be assembled in an array of rows and columns to form a radiation detection panel. By sequentially reading out the charges accumulated in the individual sensors an image of the relative exposure of different areas of the panel is obtained. This image represents the radiation intensity incident on the panel after it has passed through a subject illuminated by the radiation. When the radiation is X-ray radiation and the subject is a patient the resulting image is a radiogram, captured as a plurality of charges. This radiogram can be displayed on a Cathode ray tube or other device for viewing.

The charge stored in the capacitor is read-out using a switch which connects, upon command, the middle electrode to the input of the charge measuring device. In practice such switch is usually an FET transistor created integrally with the sensor, having its drain connected directly to the middle electrode of the sensor. Both the source and the gate are accessible from outside the sensor. The source is connected to the charge integrator. A pulse applied to the gate switches the transistor to a conductive state and permits the charge to flow from the capacitor to the integrator for detection.

The above described technology is well known in the art and well described in a number of publications and issued patents, exemplary of which is U.S. Pat. No. 5,319,206 issued Jun. 7, 1994 to Lee et al., and hereby incorporated by reference herein.

When an array of sensors is used, there is need to have a plurality of connecting conductive lines extending between the sensors interconnecting the gates, and sources of the FETs so that the FETs may be addressed and the signal from the capacitors retrieved. The use of a transistor as a switching device necessitates two lines, one for addressing the transistor to turn it on/off and the second for flowing the charge to the integrator.

The simplified sensor and transistor structure described above while quite adequate is, however, vulnerable to overexposure. The term "exposure" is used in this specification to designate the product of the intensity of the incident radiation times the time during which the radiation impinges on the sensor. As the exposure increases, the charge build-up on the charge accumulating capacitor, and consequently the voltage on the middle electrode also increases, eventually exceeding the operating limits of the transistor and destroying it.

One solution to this problem is the provision of a thick, charge blocking layer, interposed between the photoconductor and the top electrode, which in effect prevent the catastrophic charge build up in the charge accumulating capacitor.

While this is an acceptable solution to the charge build up problem, the presence of the thick blocking layers requires that the sensor, following exposure and read-out of the accumulated charge in the charge accumulating capacitor, be further discharged prior to the next exposure. This extra step is not only time consuming, but inhibits the use of such type of sensors for continuous, real time imaging, such as in fluoroscopy applications.

It is an object, therefore, of the present invention to provide a sensor which is protected from catastrophic failure due to overexposure, and an associated panel comprising a plurality of such sensors, where the lines leading to the sensors are minimized and which has fast response for use in real time viewing applications.

SUMMARY OF THE INVENTION

The aforementioned objectives are achieved by a radiation sensor according to this invention which comprises:

1. a charge accumulating capacitor comprising:
   a) a first conductive microplate;
   b) a dielectric over said first microplate;
   c) a second conductive microplate overlaying said first microplate;
2. a photoconductor over said second microplate;
3. a top electrode overlaying said photoconductor and said microplates;
4. a diode having a first, input terminal and a second, output terminal, the input terminal directly connected to said second microplate;
5. a programmable source of a charging and a biasing voltage connected to said top electrode and said first microplate respectively for applying a charging voltage to the top electrode and a bias voltage of an opposite polarity to said first microplate; and
6. a diode reference biasing voltage applied to the second terminal of the diode.

Still in accordance with this invention there is contemplated a radiation detection panel comprising a plurality of the sensors described above, spaced from each other and arranged in rows and columns, wherein the top electrodes of all sensors are all connected to each other and wherein the second terminals of all diodes in each column are all connected to a common read-out line and the first microplates in each row are all connected to a common bias line and wherein the read-out line is connected to a charge measuring device.

It is a further object of this invention to provide a radiation detection method comprising exposing the above described sensor to radiation and reading out a radiation induced charge stored in the charge accumulating capacitor comprising:

1. applying a charging voltage of a first (positive) polarity to the top electrode;
2. also applying an initial bias voltage having a polarity opposite to the charge voltage polarity and a magnitude such that the diode remains reverse biased for a preselected range of radiation exposure of the sensor;
3. exposing the sensor to radiation;
4. altering the initial bias voltage to change the voltage applied to the second microplate with respect to the common reference to a value which will cause the diode to become forward biased thereby flowing any charges accumulated in the capacitor to the charge measuring device;
5. detecting an output of the charge measuring device as a measure of the intensity of the radiation incident on the sensor; and
6. returning the altered bias voltage to the initial bias voltage thereby again reverse biasing the diode.

There is finally also an object of this invention to provide a method for detecting image wise intensity modulated radiation incident on a panel comprising a plurality of sensors as discussed above, comprising the steps of:

1. applying a first charging voltage of a first (positive) polarity to the top electrode;
2. also applying an initial bias voltage to each bias line, having a polarity opposite to the charge voltage polarity and a magnitude such that the diode remains reverse biased for a preselected range of radiation exposure of the sensor to each bias line;
3. exposing the sensor to imagewise modulated radiation;
4. altering the initial bias voltage on one bias line to change the voltage at the second microplate of each sensor in one row to a value which will cause the diodes in the sensors in the row to become forward biased thereby flowing any charges accumulated in the capacitors in each sensor through the read-out line to the charge measuring device connected to each column;
5. detecting an output of the charge measuring device in each column;
6. returning the altered bias voltage on the one bias line to the initial bias voltage thereby again reverse biasing the diodes in the row; and
7. repeating steps 4 through 6 for a different one bias line addressing all rows to detect an output of all sensors in the panel to obtain a signal representative of the imagewise modulated radiation incident on the panel.

It is also an objective of this invention to repeat step 7 continuously so long as the exposure of the panel to radiation continues to provide continuous real time image capture and display. In that case, steps 4–7 of the above described process are repeated as long as the radiation impinges on the panel.

The output may be displayed directly on a cathode ray type or other display device, in real time, or stored, preferably in digital format, for later reconstruction and display of an image.

BRIEF DESCRIPTION OF THE DRAWINGS

The invention can be more fully understood from the following description thereof in connection with the accompanying drawings described as follows.

DESCRIPTION OF THE PREFERRED EMBODIMENT(S)

Figure 1:
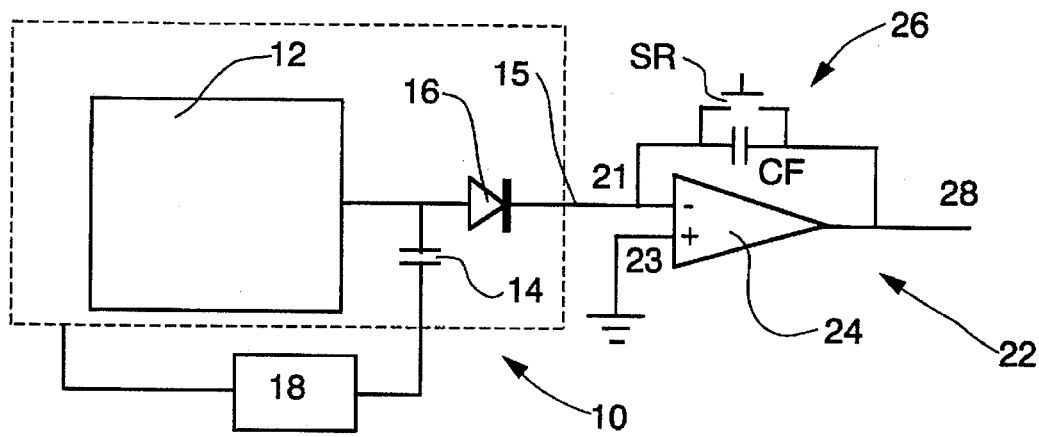
FIG. 1 is a representation of the electrical equivalent of a sensor in accordance with the present invention.

Throughout the following detailed description, similar reference characters refer to similar elements in all figures of the drawings.

Referring now to FIG. 1, there is shown a sensor 10 in accordance with the present invention. Sensor 10 comprises a radiation detector 12, a diode 16 and a charge accumulating capacitor 14. The diode 16 has a first terminal connected over line 13 to the detector 12 and to the charge accumulating capacitor 14.

Diode 16 has a second terminal connected through line 15 to an input 21 of an integrating circuit 22. Integrating circuit 22 serves to integrate the charges flowing from the accumulating capacitor 14, and to supply a diode reference bias voltage to the second terminal of diode 16. Integrating circuit 22 comprises an operational amplifier 24 having inverting and non-inverting inputs 21 and 23 respectively, and a feed-back loop 26 The integrator output appears over line 28.

Figure 2:
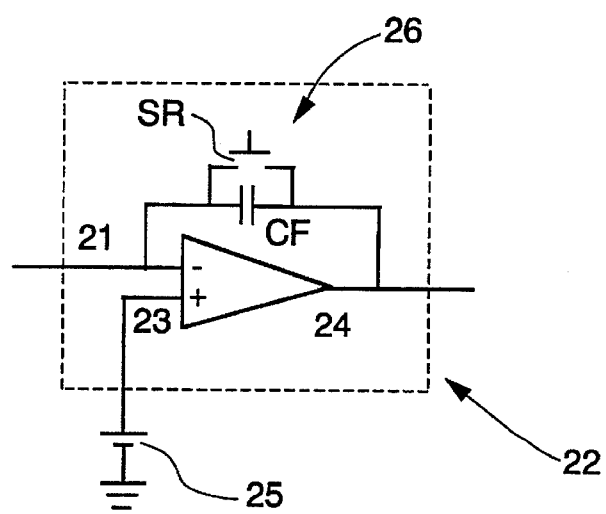
FIG. 2 shows an alternate integrator circuit used in the sensor of FIG. 1 to supply a diode reference voltage.

In the integrator circuit shown in FIG. 1 the non-inverting input of the operational amplifier 24 is grounded and the reference bias voltage is zero. FIG. 2 shows an alternate arrangement for the integrator 22 which permits selecting a desired reference bias voltage. In this arrangement, the reference voltage is selected to have a desired value by connecting the non-inverting operational amplifier input 23 to a reference bias voltage source 25.

Figure 3:
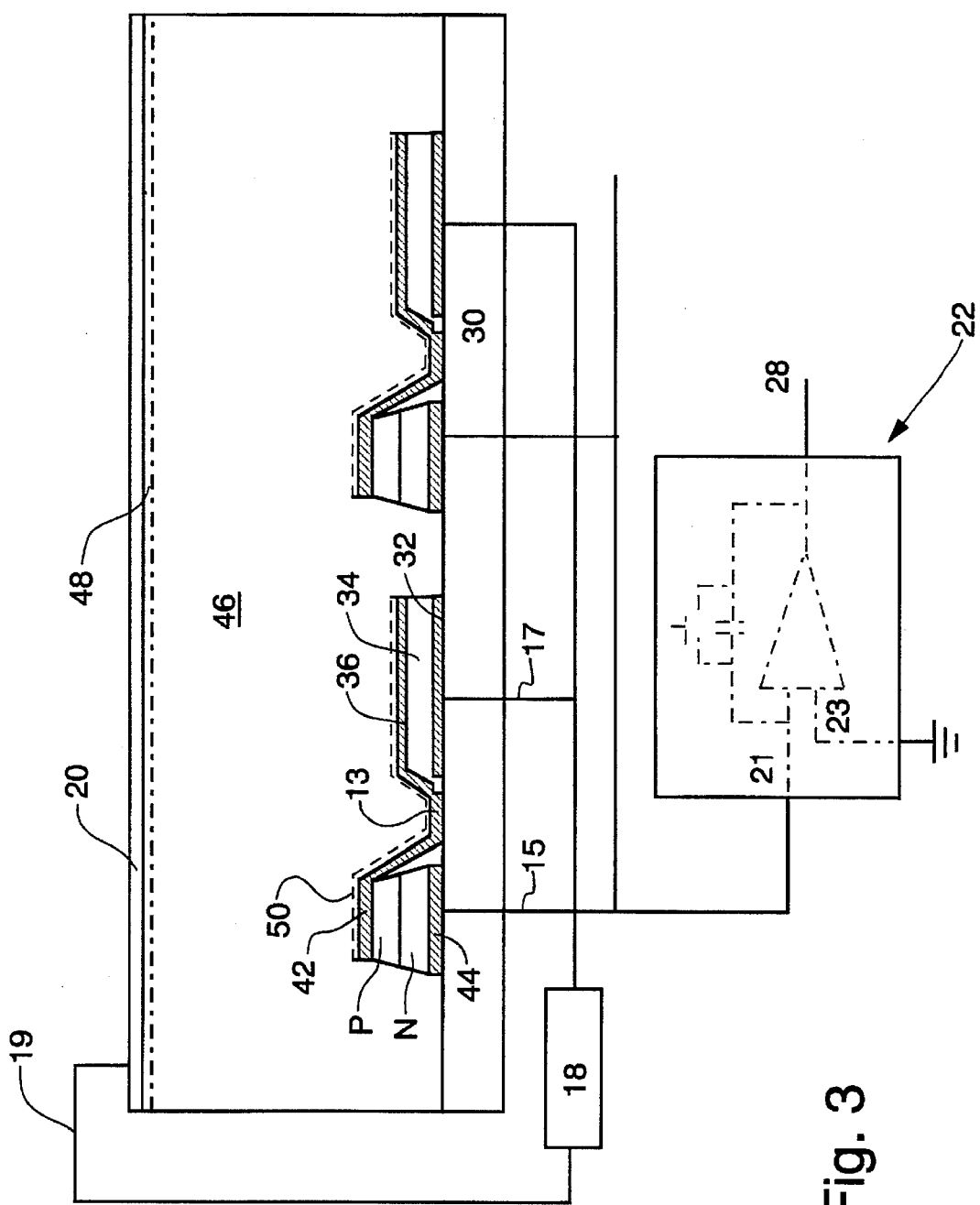
FIG. 3 shows a schematic elevation cross section of a panel comprising plurality of radiation sensors in accordance with the present invention.

FIG. 3 illustrates in a schematic elevation the internal structure of sensors under this invention. The sensors are built on a substrate 30 which may be glass, ceramic, or other suitable insulating material which provides enough mechanical strength to support the layers and circuitry comprising the sensor.

Referring to FIG. 3, there are shown two conductive elements 32 and 44, placed adjacent each other. The conductive elements may be thin layers of a conductive material such as indium-tin-oxide, or a thin layer between 50 Å and 100 Å of metal. Element 32 forms a first conductive microplate 32. Microplate 32 is covered by a dielectric layer 34. A second conductive microplate 36 is placed over the dielectric and aligned with the first microplate to form the charge accumulating capacitor 14.

An N-doped semiconductor material is deposited over conductor 44, and a P-doped semiconductor material is deposited over the "N" type to form a thin film diode 16. Typical thickness of the charged doped layers are 25–100 nanometers. A conductor placed over the "P" type material provides the first diode terminal 42, hereinafter diode input 42. Diode input 42 is connected through a short conductive strip 13 to second microplate 36. The conductor under the N-doped material forms the second diode terminal 44, referred to from here on as the diode output 44.

A photoconductive layer 46, which preferably exhibits very high dark resistivity overlays the previously deposited layers. The photoconductive layer may comprise amorphous selenium, lead oxide, thallium bromide, cadmium telluride, cadmium sulfide, mercuric iodide or any other such material. It may comprise organic materials such as photoconductive polymers which may be loaded with X-ray absorbing compounds which exhibit photoconductivity when the captured radiation is X-ray radiation. In a preferred embodiment, this layer is a continuous amorphous selenium layer 300 to 500 micrometers thick produced by Noranda Advanced Systems Corp. Of Montreal Canada.

A conductive top electrode 20 is placed over the photoconductive layer. Top electrode 20 is preferably a layer of Indium-tin-oxide; other conductive material such as chromium, Aluminum, etc may be used. The top electrode should be selected so that it is substantially transparent to the radiation one wishes to detect. When such radiation is X-ray radiation the top electrode is preferably a conductive layer which is highly penetrable by such radiation.

A programmable power supply 18 which is a source of a charging voltage for applying a charging voltage to the sensor, and of a biasing voltage for applying a biasing voltage of opposite polarity to the charge accumulating capacitor 14 is connected to the top electrode 20 and the first microplate of capacitor 14.

In a preferred embodiment two very thin charge blocking layers, 48 and 50 are placed between the conductive elements and the photoconductive layer. Such blocking layers, when present, are of the order of a few hundred angstroms, as contrasted with the blocking layers of the prior art which are of the order of tens of microns.

The technology for creating the sensors is preferably vacuum deposition of alternating layers of conductive, dielectric and insulating materials, and is well known in the art. See for instance "Modular Series on Solid State Devices" Volume 5 of Introduction to Microelectronics Fabrication by R. C. Jaeger, published by Addison-Wesley in 1988.

a) Protection of Sensor Elements from Catastrophic Overexposure

Figure 4:
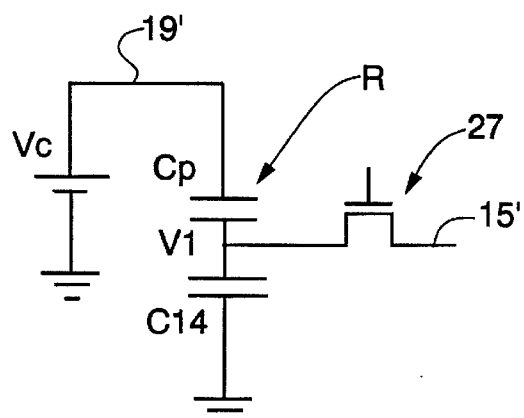
FIG. 4 shows a simplified electrical equivalent circuit of a sensor of the prior art.
Figure 5:
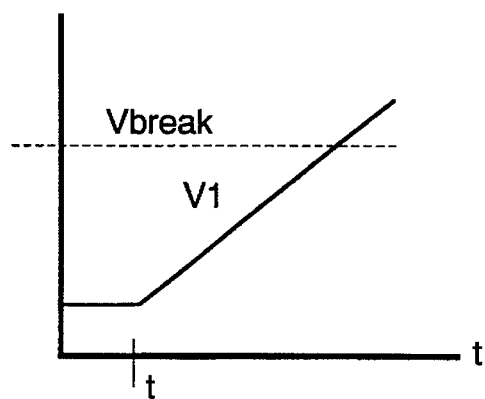
FIG. 5 shows the change in the voltage on the FET source electrode of the prior art sensor shown in FIG. 4 as a result of exposure of the sensor to radiation.

FIGS. 4 and 5 illustrate an important problem with the prior art sensors. FIG. 4 is a schematic representation of a simplified electrical equivalent circuit for a prior art sensor such as shown in the aforementioned article and patent references. The sensor is replaced by two capacitors. Capacitor Cp represents the capacitor created by the top electrode, the photoconductor and the second microplate; Capacitor $C_{14}$ is the charge accumulating capacitor 14, shown in FIG. 1, formed by the first and second microplates and the dielectric layer separating the microplates.

Typically, the prior art sensors use an FET transistor as a switch 27, to control the flow of charges accumulated in the charge capacitor $C_{14}$ to a detector circuit over line 15'. The FET transistor gate is separately addressed to turn the FET switch on-off.

A high charging voltage Vc (of the order of +5,000 Volts or more) is applied through a programmable power supply to the top electrode via line 19'. This voltage is divided between the two capacitors, Cp and $C_{14}$. Capacitor Cp is much smaller than Cs and most of the voltage drop appears across Cp. Thus the voltage $V_1$ appearing at the FET input is very low when the photoconductor does not conduct.

When this sensor is exposed to radiation, shown as arrow "R" in FIG. 4, beginning at a time $t_1$, the photoconductor resistivity decreases and a charge Q begins to flow into capacitor $C_{14}$. As a result, voltage $V_1$ starts to increase, and the voltage increase ($\Delta V$) is proportional to the charge accumulating in the capacitor. ($\Delta V=\Delta Q/C$). As the exposure continues, $V_1$ increases until it reaches a level $V_{break}$ where it exceeds the operating limits of the FET transistor resulting in destruction of the transistor and the sensor.

To prevent this situation the prior art has applied relatively thick, charge blocking layers, between the top electrode and the photoconductor and between the photoconductor and the top microplate. These layers which have thicknesses of the order of tens of microns, limit the maximum charge allowed to accumulate in charge accumulating capacitor $C_{14}$, and prevent the destruction of the FET switch for reasonable overexposure of the sensor. The disadvantage is that the blocking layers form secondary capacitors which also collect charges, and these charges must be cleared after each exposure, making such system impractical in applications where real time continuous imaging is desired.

Figure 6:
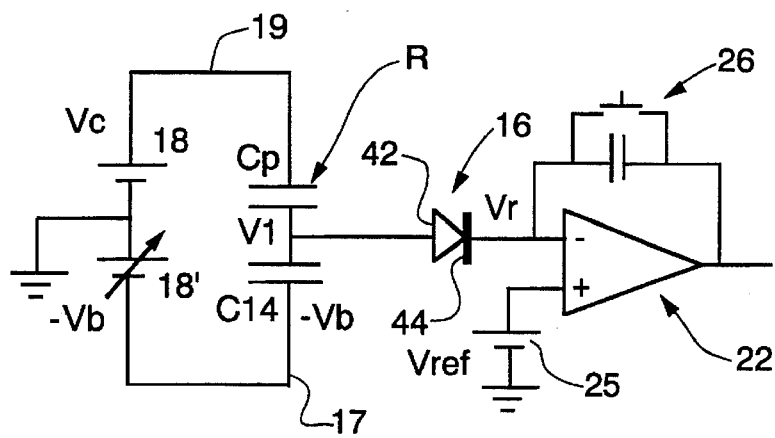
FIG. 6 shows a simplified electrical equivalent circuit of the sensor of this invention.
Figure 7:
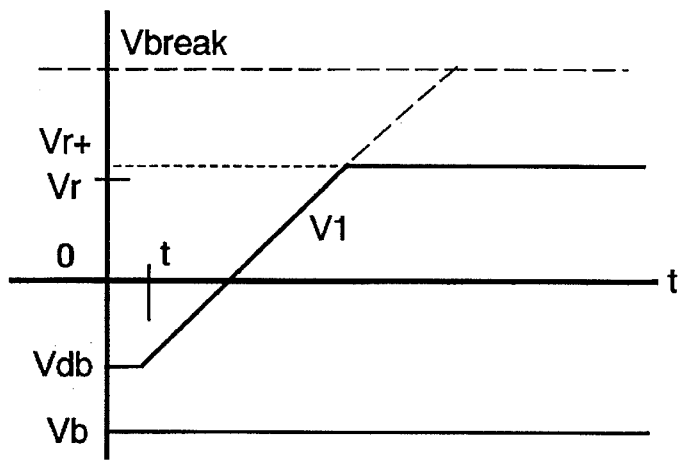
FIG. 7 shows the change in the voltage on the diode input terminal of the sensor shown in FIG. 6 as a result of exposure of the sensor to radiation.

FIGS. 6 and 7 help illustrate how the present invention eliminates the above problems. In FIG. 6, Capacitor $C_{14}$ is not grounded at one end but has a bias voltage $-V_b$ applied to it. This bias voltage is of opposite polarity from the charging voltage $+V_c$ applied to the top electrode of the sensor. The bias voltage $-V_b$ is selected so that diode 16 is reverse biased.

A reference bias voltage $V_r$ is preferably applied to the output diode terminal 44. In the preferred embodiment, which uses the integrator circuit shown in FIG. 3, the source of this reference bias voltage is power supply 25. The reference voltage level $V_r$ is directly related to the voltage output of the power supply 25. If for instance the power source was eliminated and the non-inverting input of the operational amplifier was grounded, the reference voltage would be zero. If the bias source output was +10 volts then the reference voltage $V_r$ appearing on inverting terminal of the amplifier would also be +10 volt, and so on.

With a bias voltage $-V_b$ applied to the accumulating capacitor $C_{14}$, in the absence of incident radiation, the voltage $V_1$ appearing on line 13 and on the diode input terminal is $-V_{db}$ volts.

When, at time $t_1$ the radiation exposure of the sensor begins, V1 again increases with exposure. However as shown in FIG. 7, once V1 reaches a value which exceeds the reference value $V_r$ by the diode forward voltage drop $V_f$, diode 16 becomes forward biased and begins conducting, directing all further charges to the charge integrator. The level of $V_1$ will remain indefinitely to a level equal to the reference voltage plus the voltage drop in the diode, (i.e for a diode having a voltage drop of 0.6 volts, and $V_r$ set at +5 Volts, $V_1$ will be about 5.6 volts). Therefore the diode will be protected from burnout.

The reset switch of the integrator is set at the closed position, preventing charge integration which would eventually destroy the integrator.

b) Radiation Detection and Read-Out

The sensors of this invention are intended to detect incident radiation in a useful manner, that is in a manner which can be used to supply data related to the exposure of the sensor. How this is done is now explained with reference to FIG. 8.

Figure 8:
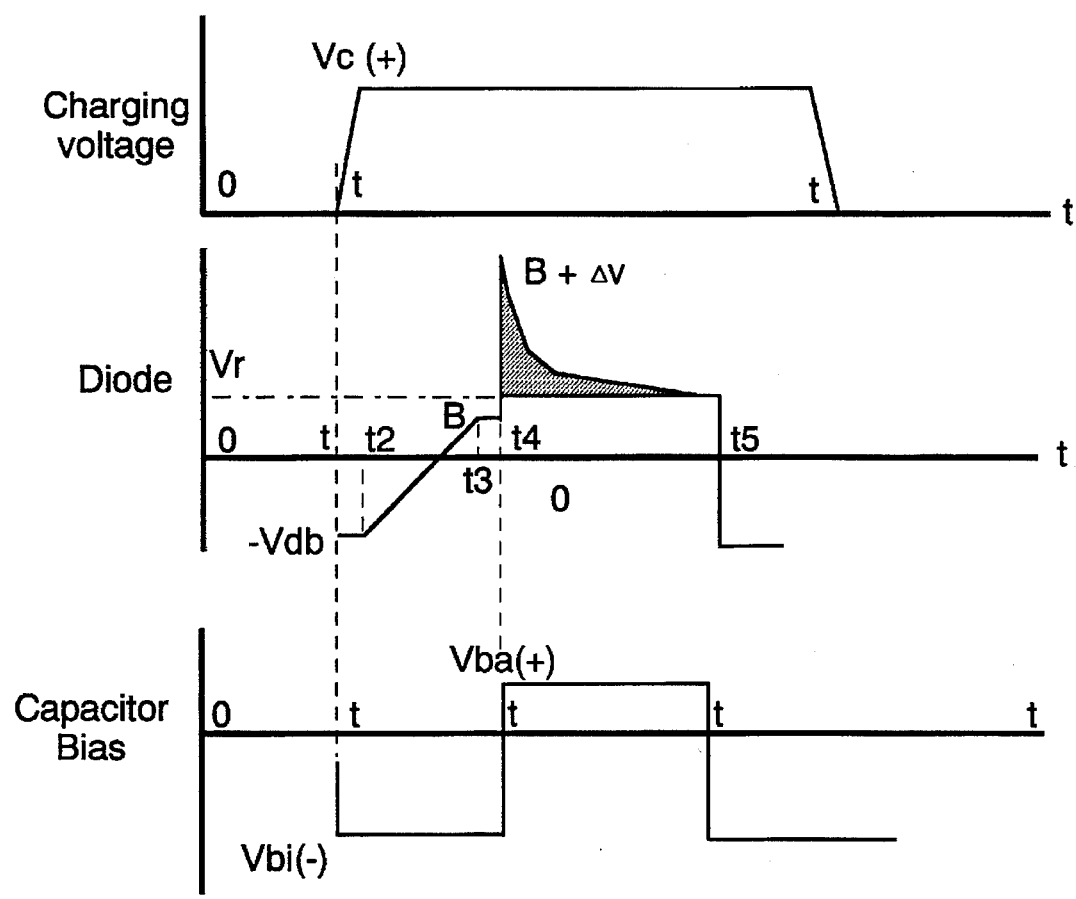
FIG. 8 shows the voltage changes in the input terminal of the diode of single sensor as a result of altering the bias voltage to the charge accumulating capacitor and exposure to radiation.

FIG. 8, contains three curves representing three different voltages measured on the sensor of FIG. 6. Curve I, represents the charging voltage $V_c$ applied to the top electrode. Curve II shows the voltage appearing on the input terminal of the diode 16. Curve III shows the charge capacitor bias voltage applied to the capacitor from the programmable bias source 18' over line 17.

At a time $t_1$ a positive charging voltage of $+V_c$ Volts is gradually applied (at a controlled ramp rate) to the top electrode of the sensor from the programmable power source 18. The nature of the photoconductive materials used in the sensor determines whether the charging voltage will be negative or positive. If the charging voltage is negative, the bias voltage will be positive and the diode will also be reversed.

At the same time $t_1$, (as shown in curve III) an initial negative bias voltage of $-V_{bi}$ Volts is applied to the charge accumulating capacitor over bias line 17. The source 18' of this bias voltage (shown as a separate power source in this figure) is, preferably, also supplied from the programmable power source 18.

Diode 16 is reverse biased and has a reference voltage of $+V_r$ Volts applied to its output terminal 44 through the inverting terminal of the operational amplifier in the integrator 22. The forward voltage drop in the diode is again $V_f$.

The sensor is exposed to radiation "R" of a given intensity beginning at time $t_2$ and ending at a time $t_3$. As shown in curve II, the voltage on the diode input terminal rises from the initial value $-V_{ab}$ to a final value B, which is below the reference voltage $V_r$. In this illustration the exposure is controlled and so there is no overexposure of the sensor, and the diode remains reverse biased. Charges accumulated in the charge accumulating capacitor remain trapped there.

The voltage range between $-V_{ab}$ and $V_r$ defines the dynamic exposure range of this sensor. That is this sensor will accurately provide information about an exposure range varying from zero exposure to an exposure which produces sufficient stored charge in the charge capacitor to bring the diode input terminal to a voltage just under $V_r$.

To read-out the charge trapped in the charge capacitor $C_{14}$, the capacitor bias voltage is next altered at a time t4, by increasing the bias from $-Vbi$ to $+Va$ Volts. This voltage differential ($\Delta V$) is selected to raise the voltage on the diode input terminal to a value which assures that the diode will become forward biased regardless of whether the sensor has been exposed to incident radiation or not.

As a result of this change in the capacitor bias voltage, the voltage on the diode input terminal 42 rises to a new value equal to $B+\Delta V$. Diode 16 begins conducting and the charge accumulated in the charge accumulating capacitor flows to the integrator 22 where it is integrated to produce an output signal representative of the exposure of the sensor. The discharging of the capacitor results in an generally exponential drop of the voltage on the diode input terminal, to value about equal to the reference voltage $V_r$ plus the forward voltage drop $V_f$ of the diode.

The shaded area 60 in the diode input curve II represents the charge accumulated in the charge accumulating capacitor due to the incident radiation exposure which flows to the integrator, and is the charge that after integration becomes the signal indicative of the exposure of the sensor.

After allowing a sufficient time period to completely discharge the charge accumulating capacitor, e.g. 10 time constants, at time $t_5$ the bias voltage is returned to the initial bias value Vbi, reverse biasing the diode again and stopping any further charge flow from the charge capacitor to the integrator. The sensor is now ready for another exposure and read-out cycle.

c) Structure of an Imaging Panel Comprising a Plurality of Sensors

Figure 9:
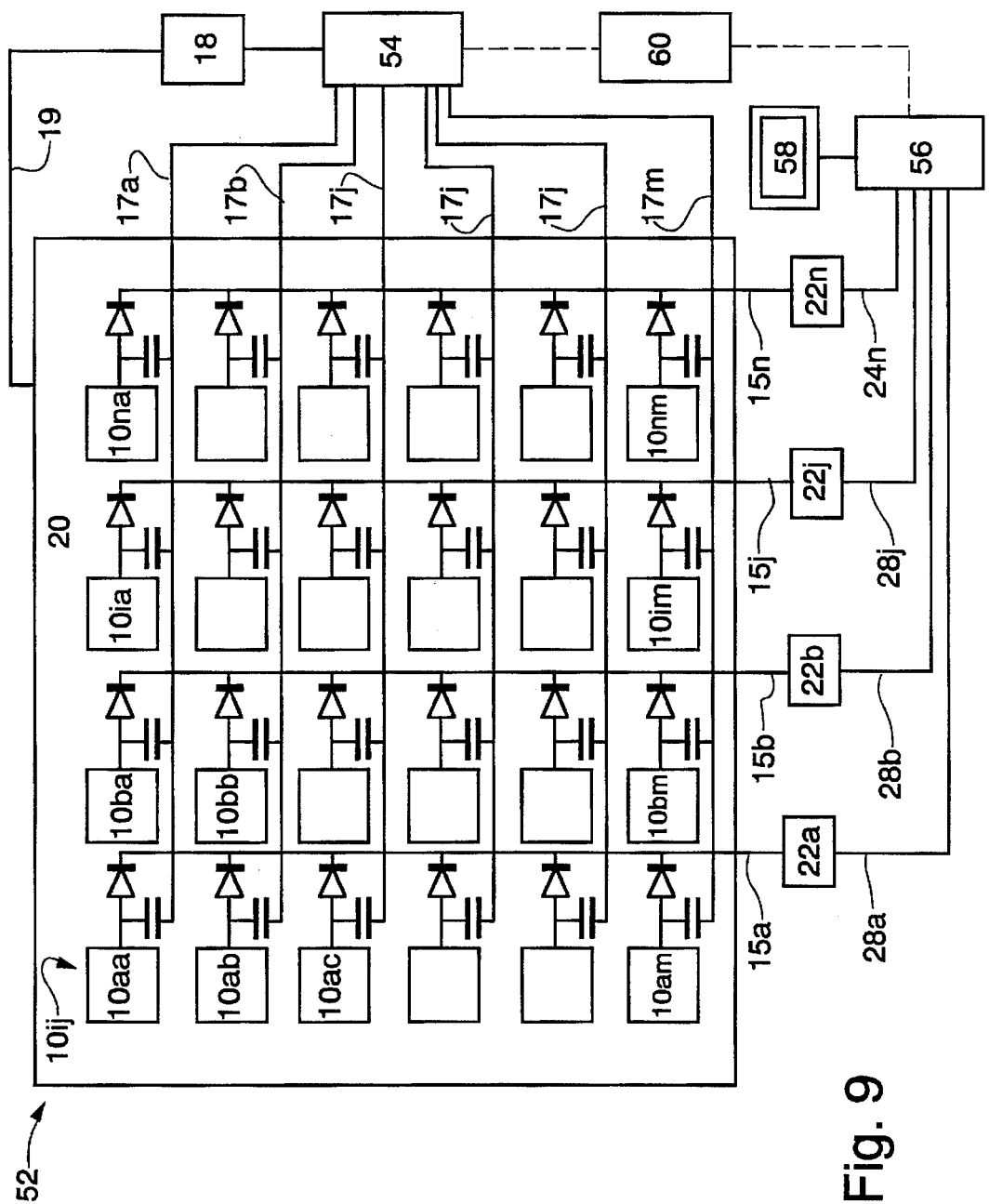
FIG. 9 shows in schematic representation a panel comprising a plurality of sensors according to this invention arrayed in a plurality of rows and columns, together with supporting electronic circuitry.

Using a single sensor to detect incident radiation is not usually the most effective method for obtaining a complete image. In most practical applications a plurality of sensors such as described above will be used in an arrangement as illustrated in FIG. 9 to form an imaging panel 52.

Panel 52 is formed using a plurality of sensors 10$ij$ arranged in columns "i" and rows "j", beginning with sensor 10$aa$ and ending with sensor 10$nm$. All sensors 10$ij$ in each row j have the first microplate 32 of charge accumulating capacitor 14 connected together through a common bias line 17$j$. All sensors in each column i have their diode output terminal 44 connected to a common readout line 15$i$. In the preferred embodiment which is designed to capture a 14×17 inch image with a resolution of 180 pixels per inch, 7.5 million sensors are used in 3000 columns and 2500 rows. The panel is preferably constructed by assembling a plurality of smaller panels as taught in U.S. Pat. No. 5,381,014 issued Jan. 10, 1995 to Lothar J. Jeromin et al. The exposure information retrieved from each sensor corresponds to an image picture element or pixel. Display of the information from all the pixels in a display in which the geometric location of the displayed pixel corresponds to the geometric location of each sensor in the panel produces an image representing the intensity modulation of the radiation incident on the panel. In the preferred embodiment, the radiation is X-ray radiation whose intensity has been modulated as it traverses a patient, and the displayed result is a medical diagnostic radiogram.

Each readout line 15$i$ terminates to input terminal 21 of an integrator 22$i$. The outputs 28$i$ of integrators 22$i$ are all directed to an image processing module 56 which includes a multiplexing circuit for individually addressing and sampling each of the integrators output, to obtain a pixel by pixel representation of the exposure of each sensor to incident radiation so as to reconstruct an image of the intensity pattern of the radiation falling onto the sensor. Image processing module 56 includes appropriate electronics for reading the output of the integrators and assembling it in a format which may be used to display an image on a display 58. The read-out may be sequential or it may be in any other convenient order.

Each bias line 17$j$ is also connected to another multiplexing circuit 54. Circuit 54 is connected to programmable power supply 18 with line 17'. Power supply 18 is also connected with line 19 to the top electrode 20. Electrode 20 preferably extends over the full panel. Electrode 20 could also be composed of a plurality of individual interconnected electrodes, each extending over a single sensor.

Programmable power supply 18 provides a charging voltage $V_c$ of a first polarity, preferably a positive voltage which is applied to the top electrode 20 over line 19, and a variable bias voltage $(-V_{bi})$ of an opposite (negative) polarity, which is applied to charge capacitors 14 through multiplexor 54 over lines 17j. This bias voltage magnitude may be altered at will. The voltage change may be done automatically via internal programming of the power supply, or on command from a control module 60. Control module 60, when used, may also control image processing module 56.

In the preferred embodiment a single unified control module is used to control the multiplexors, the image capture, and the image display electronics. Such controls and associated electronics are well known in the art, and typically include a computer or other CPU and associated memory for providing programmed commands and for handling the signal output of the integrators and reconstructing the image represented by such signal.

The panel 52 may be used to capture a single image such as a radiogram, or it may be used for continuous viewing of changing images in real time such as fluoroscopic examinations.

d) Operation of the Panel to Capture a Single Image

The operation of the panel shown in FIG. 9 in which the integrators are as shown in FIG. 2, for capturing, reading out and displaying a single image, will now be explained with reference to FIG. 10 in which, a) the charging voltage Vc applied to the panel is shown in Curve I,
b) the diode input terminal voltage is shown in curve II,
c) the capacitor bias voltage for an element 10nm of a panel containing n columns and m rows of elements 10ij is shown in curve III, and
d) the reset switch actuating voltage in the integrator feed back circuit is shown in curve IV.

As seen in curve IV, no voltage is initially applied to the reset switch Sr in feedback loop 26 of integrating amplifiers 22a through 22n, and the reset switch is closed, short circuiting feedback capacitor Cf. Also initially a capacitor bias voltage −Vbi as shown in curve II is applied over bias lines 17a through 17m to all charge accumulating-capacitors 14ij in the panel. As a result, the voltage appearing on the diode inputs 42 is a negative bias $-V_{ab}$ shown in curve II. Through their connection over output lines 15a through 15n all diodes 16ij are reverse biased by a reference voltage $V_r$. This diode reference voltage can be zero, but is preferably a small positive voltage +Vr. The diodes are in a non conducting state.

The panel in this description is used to detect X-ray radiation and provide a radiogram. The panel is placed in an enclosure which is penetrable to X-ray radiation but which is opaque to radiation in the visible, infrared and Ultraviolet spectrum. In the absence of X-ray radiation, the photoconductive layer 46 exhibits very high dark resistivity.

Figure 10:
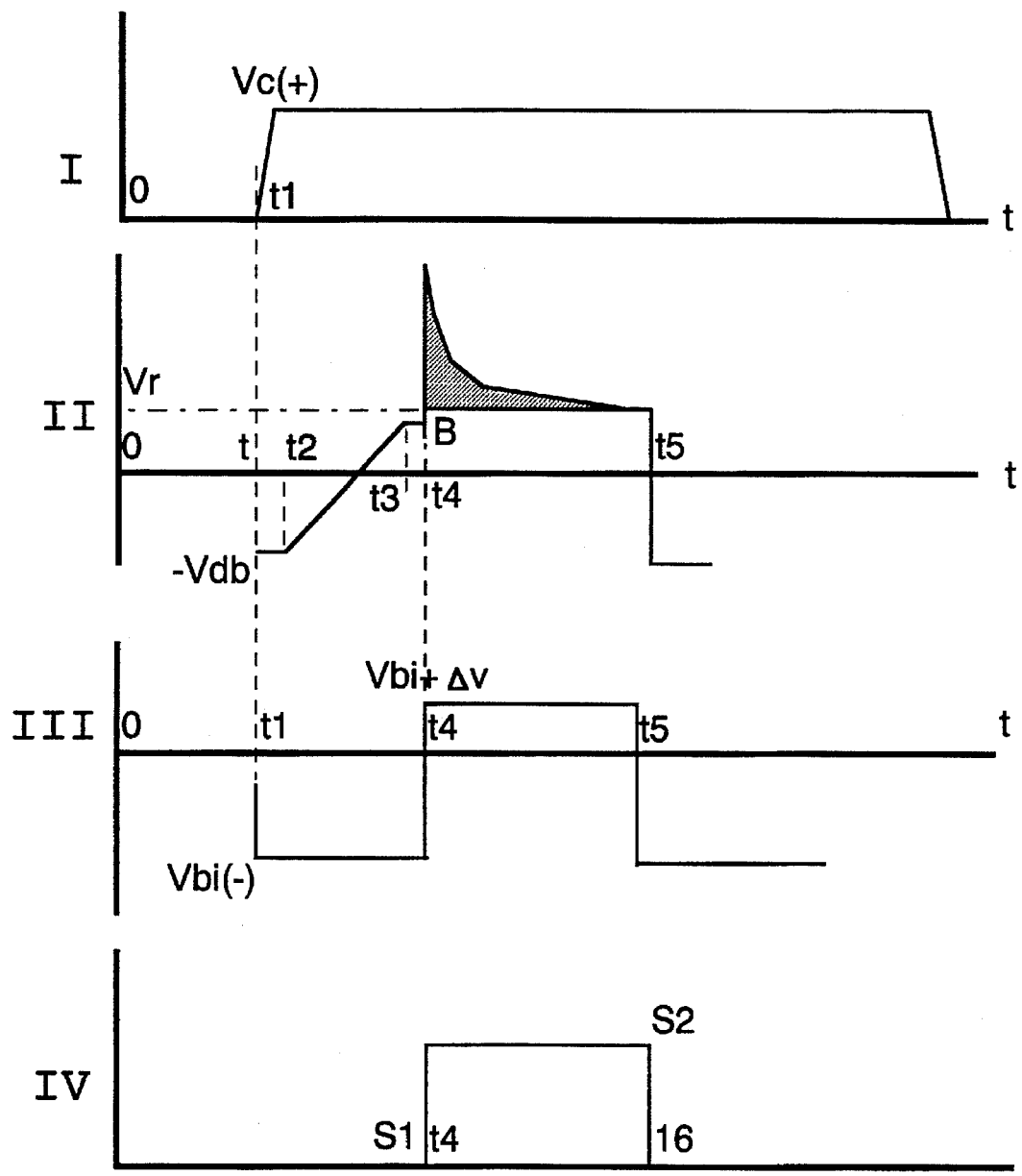
FIG. 10 shows the voltage variation on different points in the sensor, for one of the sensors of the panel shown in FIG. 9 when the panel is used to capture a single image.

As shown in curve I of FIG. 10, at a time $t_1$ a charging voltage Vc is applied to the top electrode of the panel through the programmable power supply 18 over line 19. At a second time $t_2$ the panel is irradiated with X-ray radiation for a period of time $t_3-t_2$. The radiation intensity and time duration is preferably calculated to result in an exposure level of the panel which will not raise the voltage at the diode input to above Vr, the value at which the diode becomes forward biased, as discussed earlier.

Prior to impinging on the panel the radiation is directed through a patient undergoing X-ray examination. The impinging radiation is therefore imagewise modulated through differential absorption in the patient tissues and bones. Therefore the exposure received by each element 10ij will depend on the radiation intensity incident on this element. Each element represents a pixel of the radiogram.

At a time $t_3$, the radiation exposure is terminated. The voltage at each diode input has risen to a voltage $B_k$ which is proportional to the exposure received by each element 10ij, and which for a constant irradiation time is proportional to the intensity of the incident radiation.

Curve II shows the input diode terminal voltage for one pixel. All pixels follow the same pattern, each reaching a different level $B_k$.

The image may remain in the form of trapped charges in the charge accumulating capacitors 14 for an indefinite time. Some degradation due to charge leakage will occur over time, however such leakage is not significant provided the panel is protected from exposure to either radiation which could effect the dark resistivity of the photoconductor.

Read-out of the accumulated charges is next performed as follows:

Beginning at a read-out time t4, the capacitor bias voltage $-V_{bi}$ is altered on a first row over a first bias line 17a through the programmable power supply 18 and the multiplexing circuit 54. This can be done on command from a control module, not illustrated, or through pre-programming of the power supply. Programmable power supply 18, alters the bias voltage to the first bias line 17a by raising it to a value $-V_{bi}+\Delta V$. As a result the voltage appearing on the diodes input in this row is also raised by $\Delta V$ to a value $B_k+\Delta V$, which renders the diode conductive as explained when the operation of a single sensor was described earlier. Immediately each diode in each sensor in this row of sensors becomes forward biased and the charge accumulated in each sensor in the row flows through readout lines 15a through 15n to the integrators 22a through 22n. Multiplexor 56 reads the output of the integrators 22i and stores the signals from the integrators for further processing and display.

After a preselected time sufficient to allow substantially all accumulated charges in the capacitors to flow to the integrators, at t5, power supply 18 returns the bias voltage on line 17a to its original value $-V_{bi}$. Reset switch is closed and re-opened. The bias voltage on a second line 17b is next raised by the same $\Delta V$ value as was done for line 17a. The process is repeated sequentially (or in any preselected order) for each row, until all rows are read-out.

The pixel by pixel output from the full panel thus obtained, is used by image processing module 56 to reconstruct and display an image representing the radiation intensity variations as it impinged on the panel 52.

e) Use of the Imaging Panel for Continuous Viewing of a Changing Radiation Pattern The panel according to this invention is also capable of continuous real time viewing of a changing images such as produced in fluoroscopy. This mode of operation is explained with reference to FIG. 11 which shows the steady state, continuous exposure capture and readout from sensors 10aa and 10ab, for use in continuous viewing of a changing image. Two sensors, each in a separate row, are used for this explanation, but it is understood that all sensors in each row are read-out at the same time.

Following a transient period during which the charging voltage +Vc is applied to the top electrode, the bias voltage $V_{bi}$ is applied to all rows and all diodes are reverse biased. Exposure of the panel to X-ray radiation begins. In this instance, radiation is continuous as for instance in fluoroscopic examination. Because radiation of the patient continues over a long period of time, the level of the radiation intensity is typically substantially lower than for single exposure radiograms requiring longer exposure times of the sensors to accumulate sufficient charges in the accumulating capacitors for a good signal to noise ratio. Since fluoroscopy image resolution requirements are not as high as for radiograms, the panel sensitivity may be enhanced by making the individual sensors larger, or by combining the output of a number of accumulating capacitors from adjacent sensors in parallel, and sending their combined output to a single charge integrator.

Figure 11:
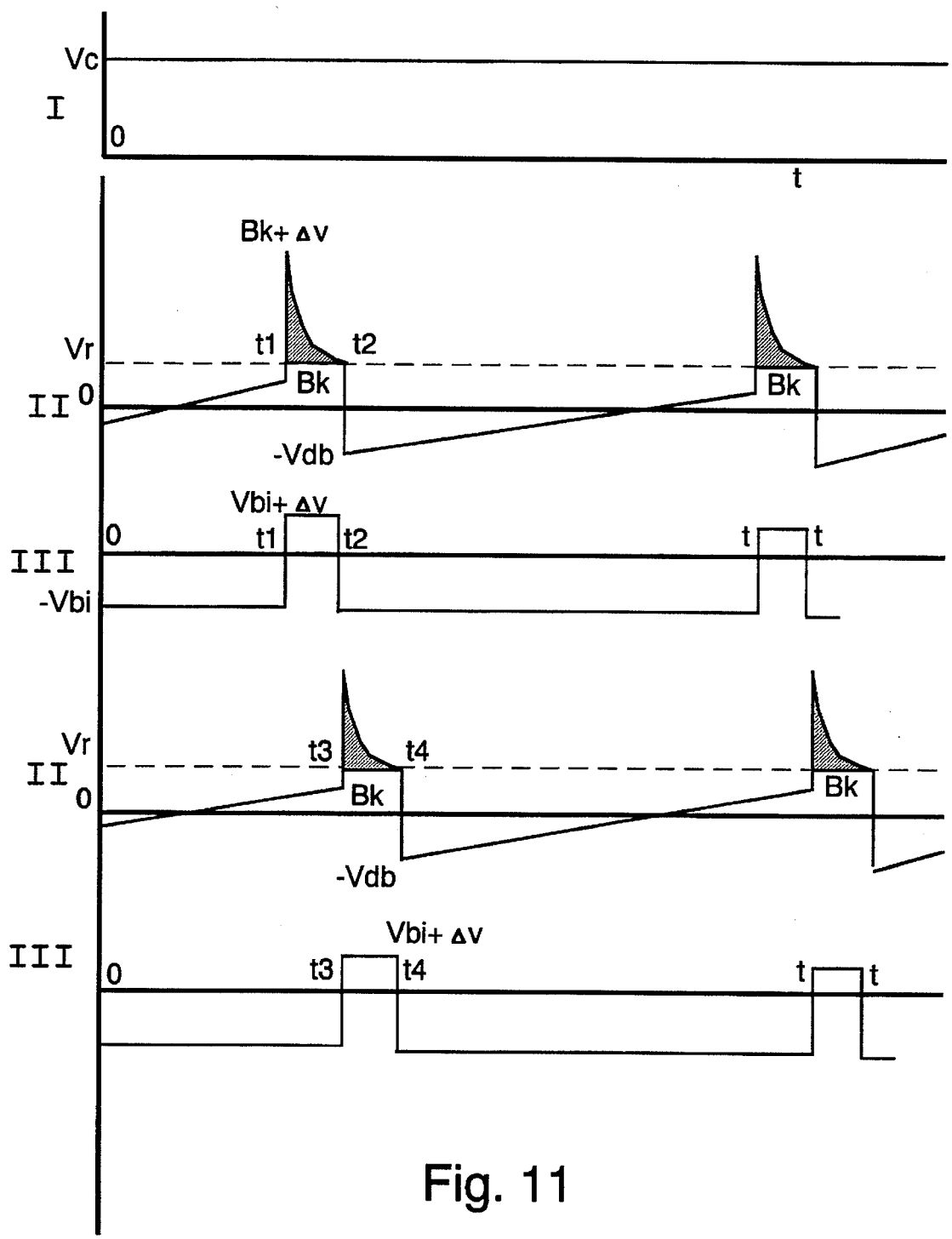
FIG. 11 shows the voltage variation on different points in the sensor, for one of the sensors of each of two rows in the panel shown in FIG. 9 when the panel is used for real time viewing of a changing image.

FIG. 11 shows the steady state voltages at representative points on the panel. Curve I shows the charging voltage on the top electrode which is maintained constant throughout the exposure. Curves IIa and IIb show the voltage on the input terminal of two diodes 16aa and 16ab of two radiation sensors 10aa and 10ab, respectively, on the same column "a" and two adjacent rows, "a" and "b". Curves IIIa and IIIb show the bias voltage −Vbi applied to the bias lines 17a and 17b respectively, through multiplexing circuit 54 and power supply 18.

At a time t1, the bias voltage on line 17a is raised from the initialization value $-V_{bi}$ by $\Delta V$ to a value $-V_{bi}+\Delta V$ which renders the diode conductive as explained when the operation of a single sensor was described earlier.

All diodes in row "a" become forward biased. As a result the charges accumulated in the charge capacitors in all sensors in row "a" flow to the bank of integrators connected to each column. Curve IIa shows the voltage at the diode input terminal 42 of diode 16aa. As shown, the voltage is raised from a value $B_k$ (representing the charge accumulated in the capacitor due to the exposure up to time $t_1$) to a value $B_k+\Delta V$. Simultaneously, the operational amplifiers in each column have their reset switches opened. The bias voltage on line 17a remains high, and the reset switches open, for a period of time sufficient to permit substantially complete discharging of the charge accumulating capacitors in row "a" and integration of the charges flowing to the integrators.

At a time $t_2$, the integrator outputs are sampled and the integration is terminated. The reset switches are closed, and the bias voltage on row "a" is returned to the initial value $-V_{bi}$. The diodes in row "a" become again reverse biased. The path between the capacitors in row "a" and the integrators is interrupted, and charges beginning again to accumulate in the capacitors. The sampled integrator output 28a through n is displayed as an image line on the display monitor 58.

At a time $t_3$, after all the integrators have been sampled, as shown in curve IIIb, the bias voltage on bias line 17b is raised by $\Delta V$ and the diodes in row "b" become forward biased. As shown in curve IIb, the charges accumulated in the charge capacitors of the elements in row "b" are now directed to the integrators 22a through 22n. At the same time t3, the integrators reset switch is opened, and the integrators begin integrating the charges flowing from the capacitors. After a time $t_5$, sufficient to substantially discharge the capacitors in each element in row "b", the integrator outputs 28a through 28n are sampled to provide a signal representing the radiation exposure on line "b". This signal is again displayed as line "b". The bias voltage on line "b" is next brought back to the initial value $-V_{bi}$, and the next line is addressed by raising its bias voltage. The process is repeated continuously, providing a continuing, real time display of the changing radiation image.

In the preferred embodiment, the sampling of the integrator output may include steps and circuitry to reduce noise components in the sampled signal. Co-pending application Ser. No. 08/583,256 filed on Jan. 5, 1996 describes a method for reducing noise due to non uniformities in the response of the elements in each row and the integrator reset switching.

The methods described in the above patent include rendering a number of sensors in the panel insensitive to incident radiation and using information from the insensitive sensors to determine row background noise level which can be subtracted from the signal from the sensors to reduce the noise level. Further more, noise generated by the switching "on-off" of the reset switches in the integrators, as taught in this reference, can be substantially eliminated by the addition of a sample and hold circuit associated with each integrator which allows sampling the integrator output prior to each integration, following switching off, and after integration to obtain a signal which is substantially noise free.

It is anticipated that such technology will be included in the preferred embodiment of the present invention, therefore, the contents of the aforementioned application are incorporated by reference in this application.

Those skilled in the art having the benefit of the teachings of the present invention as hereinabove set forth, can effect numerous modifications thereto. These modifications are to be construed as being encompassed within the scope of the present invention as set forth in the appended claims.

I claim:

1. A radiation sensor comprising:
    i. a charge accumulating capacitor comprising:
        a) a first conductive microplate;
        b) a dielectric over said first microplate;
        c) a second conductive microplate over said first microplate;
    ii. a photoconductor over said second microplate;
    iii. a top electrode overlaying said photoconductor and said microplates;
    iv. a diode having an input terminal and an output terminal, the input terminal directly connected to said second microplate;
    v. a source of a charging voltage and a source of a biasing voltage connected to said top electrode and said first microplate respectively, the biasing voltage being of a polarity opposite to the polarity of the charging voltage; and,
    vi. a source of a diode reference reverse bias voltage connected to the output terminal of the diode.

2. The radiation sensor of claim 1 further comprising a charge measuring device connected to the diode output terminal.

3. The radiation sensor of claim 2 wherein the charge measuring device is a charge integrating amplifier.

4. The radiation sensor of claim 3 wherein the integrating amplifier is also the source of the diode reference reverse bias voltage.

5. The radiation sensor of claim 4 wherein the integrating amplifier includes a power supply for producing the diode reference reverse bias voltage.

6. A radiation sensor in accordance with claim 1 further comprising an additional first charge blocking layer between said second microplate and said photoconductor.

7. A radiation sensor in accordance with claim 1 further comprising a second charge blocking layer, between said top electrode and said photoconductor.

8. A radiation sensor in accordance with claim 1 further comprising a first charge blocking layer between said second microplate and said photoconductor and a second charge blocking layer, between said top electrode and said photoconductor.

9. A radiation detection panel comprising a plurality of sensors in accordance with claim 1, said sensors spaced from each other and arranged in rows and columns, and wherein:
   a) the top electrodes of all sensors are all connected to each other,
   b) the output terminals of all diodes in each column are all connected to a common read-out line for each column,
   c) the first microplates in each row are all connected to a common bias line for each row, and
   d) the readout lines are connected to a charge measuring device.

10. A radiation panel in accordance with claim 9 wherein the top electrodes of all sensors in said panel are a single continuous conductive top electrode layer extending over all sensors in said panel.

11. A radiation panel in accordance with claim 10 wherein said photoconductive layers of all sensors are a single photoconductive layer extending under said top electrode and said second microplates.

12. A radiation panel in accordance with claim 11 wherein a single, continuous charge blocking layer extends under the top electrode layer between said top electrode layer and said single photoconductor layer.

13. A radiation panel in accordance with claim 12 wherein a charge blocking layer extends between each of said second microplates and the photoconductive layer.

14. A radiation panel in accordance with claim 11 wherein a charge blocking layer extends between each of said second microplates and the photoconductive layer.

15. A radiation panel in accordance with claim 9 wherein each of the readout lines is connected to one of a plurality of charge measuring devices.

16. A radiation panel in accordance with claim 15, wherein said charge measuring devices are charge integrating amplifiers.

17. A radiation panel in accordance with claim 16, further comprising a multiplex circuit connected to said bias lines and said source of a biasing voltage for selectively addressing each of said bias lines.

18. A radiation panel in accordance with claim 17 further comprising an image processing circuit connected to said charge integrating amplifiers, and a controller for controlling the source of a charging voltage, the source of a biasing voltage, the multiplex circuit and the image processing circuit.

19. A method for obtaining a signal indicative of the radiation exposure impinging on a radiation sensor, said sensor having a top electrode, a photoconductor, a charge accumulating capacitor including a first and a second conductive microplates, and a diode having an input terminal directly connected to said second microplate and an output terminal connected to a charge measuring device, the method comprising the steps of:
   I. gradually applying a charging voltage of a first polarity to the top electrode;
   II. applying to the first conductive microplate an initial capacitor bias voltage, having a polarity opposite to the charging voltage polarity and a magnitude Vbi such that the diode is reverse biased for a preselected range of radiation exposure of the sensor;
   III. exposing the sensor to radiation;
   IV. altering the capacitor bias voltage from the initial magnitude Vbi to a final magnitude Vba, which will cause the diode to become forward biased thereby flowing any charge accumulated in the charge accumulating capacitor to the charge sensing device;
   V. detecting an output indicative of the charge in the charge measuring device.

20. The method according to claim 19 wherein a voltage measured on the diode input following step II and before step III, is equal to Vdb, the diode is reverse biased when a voltage measured on the diode input is less than Vr and wherein Vba–Vbi is equal to or greater than Vr–Vdb.

21. The method according to claim 20 wherein the charging voltage is a positive charging voltage, Vbi and Vdb are negative voltages and Vr is more positive than Vdb.

22. A method for detecting image wise intensity modulated radiation incident on a radiation detection panel comprising a plurality of sensors each having a top electrode, a photoconductor, a charge accumulating capacitor including a first and a second conductive microplates, and a diode having an input terminal directly connected to said second microplate and an output terminal, said sensors spaced from each other and arranged in rows and columns, and wherein the top electrodes of all sensors are all connected to each other, the output terminals of all diodes in each column are all connected to a common read-out line for each column, the first microplates in each row are all connected to a common bias line for each row, and the readout lines are each connected to a charge measuring device, comprising the steps of:
   I. gradually applying a charging voltage of a first polarity to the top electrodes;
   II. applying through each bias line to the first conductive microplates of all sensors an initial bias voltage having a polarity opposite to the charging voltage polarity and a magnitude Vbi such that the diodes in all of said plurality of sensors are reverse biased for a preselected range of radiation exposure of the sensors;
   III. allowing imagewise intensity modulated radiation to impinge on the panel;
   IV. terminating the impingement of radiation on the sensor;
   V. altering the bias voltage on one bias line to change the voltage applied to the first microplates in all sensors in one row from the initial magnitude Vbi to a final magnitude Vba, which will cause the diodes in each sensor in such row to become forward biased thereby flowing any charge accumulated in the charge accumulating capacitors through the readout lines to the charge measuring device;
   VI. detecting the output of the charge measuring device in each column;
   VII. returning the altered bias voltage on the one bias line to the initial bias voltage magnitude Vbi thereby again reverse biasing the diodes in the sensors in that row and preventing any further charges flowing to the charge measuring devices from the sensors in that row;
   VIII. repeating steps (V) through (VII) for a different one of said bias lines addressing all rows to detect an output of all sensors in the panel to obtain a signal representing the imagewise intensity modulated radiation impinged on the panel.

23. A method according to the method of claim 22 wherein a voltage measured on the diode input of each sensor following step 2 is equal to Vdb, the diodes in all sensors are reverse biased when a voltage measured on the diode input is less than Vr and wherein Vba–Vbi is equal to or greater than Vr–Vdb.

24. A method according to the method of claim 22 wherein the charging voltage is gradually removed from the top electrodes after the output of all sensors in the panel has been detected.

25. A method according to the method of claim 22 wherein the top electrodes of all sensors in the panel are a continuous single conductive layer extending over all sensors.

26. A method according to the method of claim 25 wherein the photoconductors in all sensors in the panel are a continuous single photoconductive layer extending over all sensors.

27. The method in accordance with claim 22 wherein step II includes also applying a reference diode biasing voltage to the diode output.

28. The method in accordance with claim 27 wherein the reference diode voltage is applied to the diode outputs through the charge measuring devices.

29. A method for continuously displaying time varying image wise intensity modulated radiation incident on a panel comprising a plurality of sensors each having a top electrode, a photoconductor, a charge accumulating capacitor including a first and a second conductive microplates, and a diode having an input terminal directly connected to said second microplate and an output terminal, said sensors spaced from each other and arranged in rows and columns, and wherein the top electrodes of all sensors are all connected to each other, the output terminals of all diodes in each column are all connected to a common read-out line for each column, the first microplates in each row are all connected to a common bias line for each row, and the readout lines are each connected to a charge measuring device, comprising the steps of:

I. gradually applying a charging voltage of a first polarity to the top electrodes;

II. applying through each bias line to the first conductive microplates of all sensors an initial bias voltage having a polarity opposite to the charging voltage polarity and a magnitude Vbi such that the diodes in all of said plurality of sensors are reverse biased for a preselected range of radiation exposure of the sensors; and III. allowing imagewise modulated radiation to impinge on the panel; and IV. while radiation continues to impinge on the panel:
   a) altering the bias voltage on one bias line to change the voltage applied to the first microplates in all sensors in one row from the initial magnitude Vbi to a final magnitude Vba, which will cause the diodes in each sensor in such row to become forward biased thereby flowing any charge accumulated in the charge accumulating capacitors through the readout lines to the charge measuring device;
   b) detecting the output of the charge measuring device in each column;
   c) returning the altered first bias voltage on the one bias line to the initial bias magnitude Vbi thereby again reverse biasing the diodes in the sensors in that row and preventing any further charges flowing to the charge measuring device;
   d) repeating steps (a) through (c) for a different one of said bias lines addressing all rows to detect an output of all sensors in the panel to obtain a signal representing the imagewise modulated radiation impinged on the panel; and
   e) repeating steps (a) through (d).

30. The method in accordance with claim 29 wherein the step (IVb) of detecting the output of the charge measuring devices also includes the step of displaying the detected output.

31. The method in accordance with claim 30, wherein the displaying of the detected output is a continuous real time display on a Cathode Ray Tube.

32. The method in accordance with claim 29 wherein step II includes also applying a reference diode biasing voltage to the diode output.

* * * * *